United States Patent [19]

Lengenfelder et al.

[11] Patent Number: 5,066,953
[45] Date of Patent: Nov. 19, 1991

[54] POSITION MEASURING APPARATUS WITH A SUBDIVISION CIRCUIT FOR SUBDIVIDING SINUSOIDAL SCANNING SIGNALS

[75] Inventors: Hans Lengenfelder, Mühldorf; Robert Wasthuber, Garching, both of Fed. Rep. of Germany

[73] Assignee: Dr. Johannes Heidenhain GmbH, Traunreut, Fed. Rep. of Germany

[21] Appl. No.: 432,587

[22] Filed: Nov. 7, 1989

[30] Foreign Application Priority Data

Nov. 11, 1988 [DE] Fed. Rep. of Germany ....... 3838291

[51] Int. Cl.$^5$ .............................................. H03M 1/34
[52] U.S. Cl. .................................... 341/155; 341/158; 250/563
[58] Field of Search ................. 341/155, 111, 116, 158, 341/137, 13; 318/604, 605, 661; 356/5; 307/261; 250/563, 227.26

[56] References Cited

U.S. PATENT DOCUMENTS

| | | | |
|---|---|---|---|
| 4,594,579 | 6/1986 | Schmitt et al. | 341/116 |
| 4,595,991 | 6/1986 | Spies | 364/525 |
| 4,760,280 | 8/1988 | Schwefel et al. | 307/269 |

FOREIGN PATENT DOCUMENTS

| | | |
|---|---|---|
| 0104393 | 8/1983 | European Pat. Off. |
| 2806655 | 2/1978 | Fed. Rep. of Germany |
| 58-102110 | 6/1983 | Japan |

OTHER PUBLICATIONS

Ein Laser Interferometer zur photoelektrischen Bewegungsfernmessung in beiden Lateralkoordinaten, Von der Fakultat fur Maschinenwesen der Universitet Hannover nur Erlangung des akademischen Grades, Doktor-Ingenieur genehmigte Dissertation, von Dipl-Phys. Gerd Ulbers, geb am 1.3.1949 in Oldenburg, 1981.
"Halbleiter-Schaltungstechnik", Tietze et al., Spring-g-Verlog Berlin Heidelberg New York London Paris Tokyo 1986, pp. 762, 786-791.

Primary Examiner—J. R. Scott
Assistant Examiner—Brian K. Young
Attorney, Agent, or Firm—Willian Brinks Olds Hofer Gilson & Lione

[57] ABSTRACT

In a position measuring apparatus there is provided a subdivision circuit for the subdividing of sinusoidal scanning signals. The subdivision circuit includes rectifier circuits in which the scanning signals are reformed in such a way that over a total signal period one rectified signal always has a greater signal value than the other rectified signal. The rectified signal with the greater signal value lies on one reference input and the other rectified signal lies on the other reference input of an analog-to-digital converter. The analog-to-digital converter forms from these rectified signals a binary word which is fed to a correction arrangement. Together with code signals which define four equal sections of a single period, the correction arrangement generates a data word which represents intermediate values of a signal period of the scanning signals.

20 Claims, 6 Drawing Sheets

POSITION MEASURING APPARATUS WITH A SUBDIVISION CIRCUIT FOR SUBDIVIDING SINUSOIDAL SCANNING SIGNALS

BACKGROUND OF THE INVENTION

The present invention relates generally to a position measuring apparatus, and, more particularly, to a position measuring apparatus having a subdivision circuit for subdividing sinusoidal scanning signals.

Incremental measuring systems, as is well-known, deliver impulses whose number is a measure of the linear displacement or the angle of rotation of an object being measured. These impulses are summed as path elements in a counter and are numerically displayed as a measurement value or fed to a processing machine for further processing.

The graduation of a scale is scanned by a scanning unit, so there are generated two analog scanning signals phase-shifted relative to one another by 90°. By triggering these sinusoidal scanning signals there are obtained two phase-shifted impulse sequences, from the evaluation of which there is made possible a subdivision of a graduation period or of a scanning signal period with the factor 4.

For many applications a higher subdivision factor, i.e., a higher resolving capacity, is required.

If the two analog scanning signals have a sufficiently good sinusoidal form, they can be subdivided a relatively large number of times. This subdividing is also called interpolation.

A circuit for interpolation is described on pages 63-70 of the dissertation of Dipl.-Phys. Gerd Ulbers: "A Laser Interferometer for Photoelectric Movement Telemetry in Both Lateral Coordinates" of 1981. This circuit is based on the use of two directly dividing analog-to-digital converters. Each of these analog-to-digital converters makes available the ratio of reference voltage to input voltage as a digital result at its output. The division thus performed corresponds to the tangent formation of the analog scanning signals if the larger signal amplitude of the two analog scanning signals lies on one input and the smaller signal amplitude of the other scanning signal lies on the other input of the analog-to-digital converter. In order to achieve this, two parallel analog-to-digital converters are provided which are alternately driven in dependence on the signal amplitudes of the two analog scanning signals. Since the analog-to-digital converters cannot process a negative reference signal, the amount is formed in a network in each case from the two analog scanning signals.

By the analog-to-digital converters there is generated an 8-bit data word which presents an address for a PROM, under which the corresponding arc-tangent value is given out. This value defines the position within a quarter graduation period or signal period of the scanning signals.

What is disadvantageous in this known circuit is the relatively high component costs and the alternating activation of two analog-to-digital converters.

SUMMARY OF THE INVENTION

An object of the present invention is to provide a position measuring apparatus with a subdivision circuit which makes possible a high degree of subdivision while keeping the component expenditure low.

This object is achieved by a position measuring apparatus having a subdivision circuit for subdividing position-dependent analog periodic scanning signals, the subdivision circuit having first and second analog periodic signals phase-displaced with respect to one another as inputs thereto and a digital N-bit data word which represents intermediate values of a signal period of the scanning signals as an output therefrom, characterized in that the subdivision circuit includes an analog-to-digital converter and rectifier circuits which derive from the first and second analog periodic scanning signals, first and second full-wave rectified signals, so that to a first input of the analog-to-digital converter there is applied the first full-wave rectified signal having signal values only greater than or equal to a direct-voltage constituent of the analog periodic scanning signals, and to a second input of the analog-to-digital converter there is applied the second full-wave rectified signal having signal values only smaller than or equal to the direct-voltage constituent of the analog periodic scanning signals.

With the present invention, only one analog-to-digital converter is required and, therefore, an economical construction is realizable while achieving a high subdividing factor.

The invention is explained in the following detailed description of presently preferred embodiments in conjunction with the accompanying drawings.

DETAILED DESCRIPTION OF THE PREFERRED EMBODIMENTS

Figure 1:
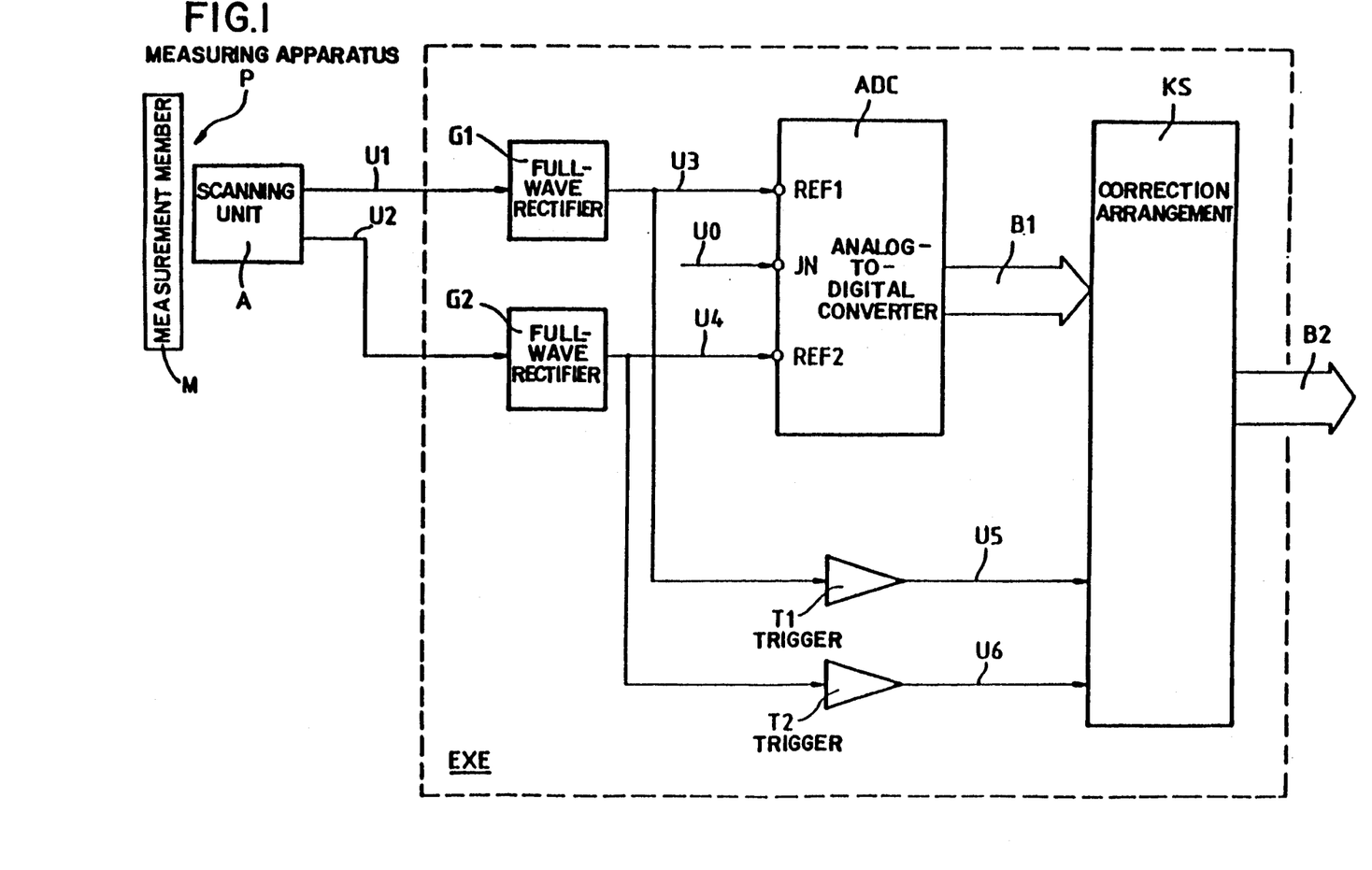
FIG. 1 schematically illustrates a position measuring apparatus with a subdivision circuit according to a presently preferred embodiment of the invention.

FIG. 1 schematically illustrates a position measuring apparatus P with a subdivision circuit EXE according to a presently preferred embodiment of the invention. The position measuring apparatus P has a measurement member M and a scanning unit A. The measurement member M and the scanning unit A are fastened in each case to one of two machine components (not shown in the Figs.), whose relative movement is to be measured. During relative movement of the machine components, analog sinusoidal scanning signals U1 and U2 are generated by the scanning unit A by scanning of the measurement member M in a known manner. For recognition of the direction of movement, the scanning signals U1 and U2 are phase-displaced relative to one another by 90° (FIG. 3a):

$$U1 = A \sin \alpha + UO$$

$$U2 = A \cos \alpha + UO$$

wherein UO in each case is the direct-voltage constituent.

Figure 3A:
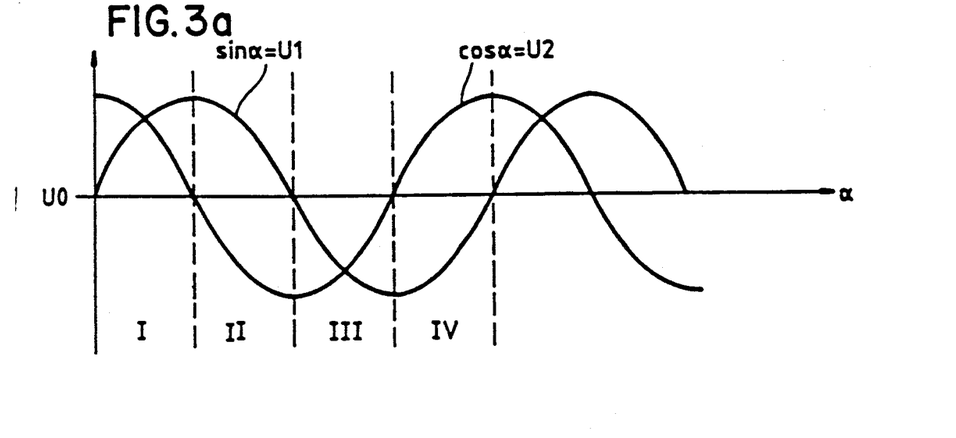
FIGS. 3a, 3b, 3c, and 3d are signal diagrams to assist in explaining operation of the position measuring apparatus of FIG. 1.
Figure 3B:
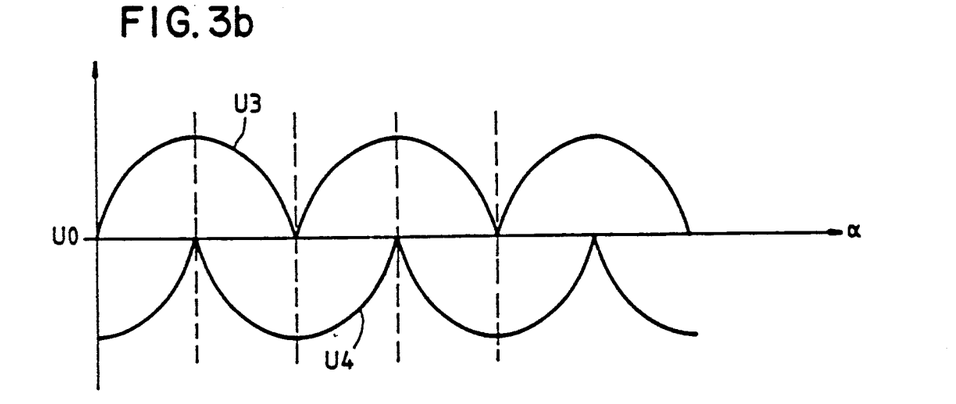

The input signal on the positive reference input REF1 of an analog-to-digital converter ADC must always be greater than the input signal on the negative reference input REF2 of the analog-to-digital converter. Further, no negative input signal must be applied to the positive reference input. In order to achieve this, the scanning signal U1 is fed to a full-wave rectifier G1, which forms the following rectified signal (FIG. 3b):

$$U3 = U1 = A\sin\alpha + UO \text{ for } U1 \geq UO$$
$$U3 = (-U1) + 2UO = A\sin\alpha + UO \text{ for } U1 < UO.$$

For the rectification of the analog scanning signal U2 there is provided a further full-wave rectifier G2, which forms from the scanning signal U2 the following rectified signal U4 (FIG. 3b):

$$U4 = (-U2) + 2UO = -A\cos\alpha + UO \text{ for } U2 \geq UO$$
$$U4 = U2 = A\cos\alpha + UO \text{ for } U2 < UO.$$

The construction of such full-wave rectifiers G1 and G2 is known and described, for example, in the book by Tietze, Schenk: *Semiconductor Circuitry Technology*, 8th Edition, Springer-Verlag 1986 on pages 786 to 789. A further explanation of the full-wave rectifiers G1 and G2, therefore, is unnecessary.

Figure 2:
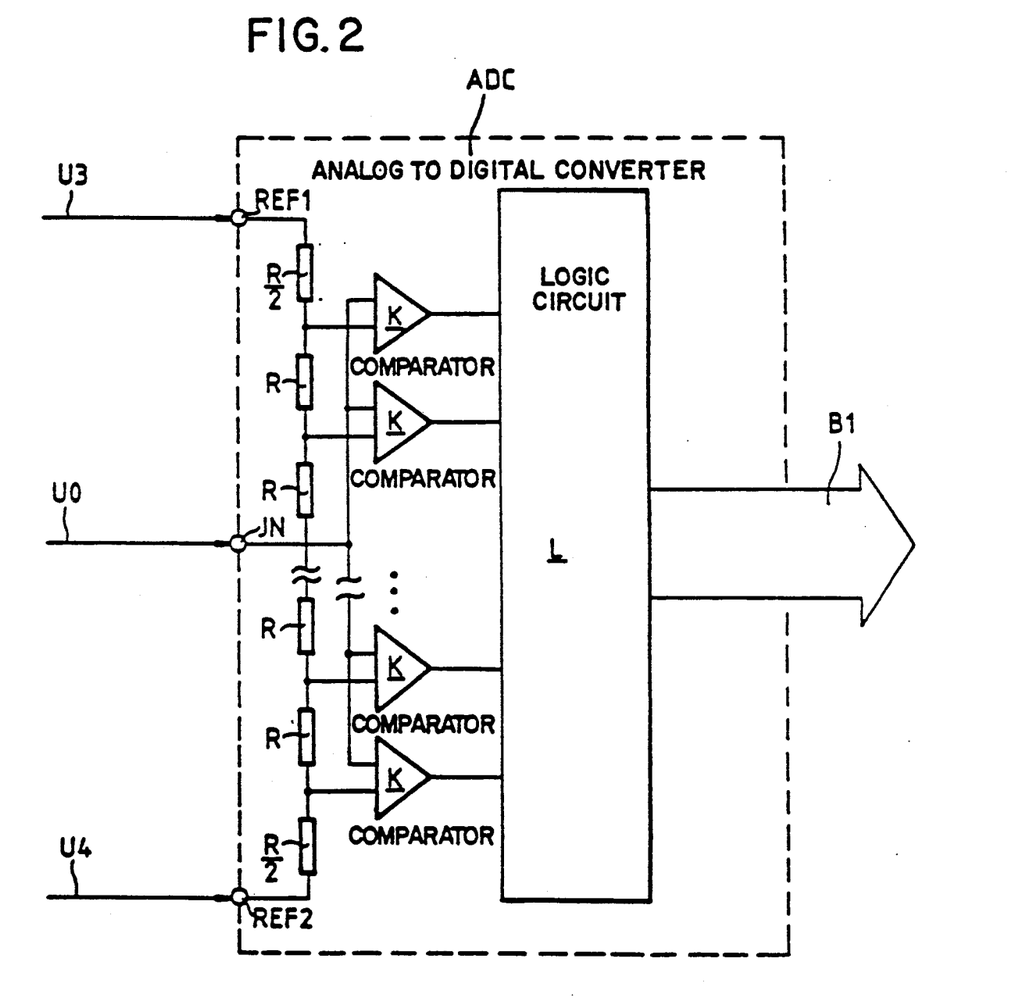
FIG. 2 illustrates the analog-to-digital converter of the subdivision circuit of FIG. 1.

The rectified signal U3 is applied to the positive reference input REF1 of the ADC (hereinafter, the analog-to-digital converter ADC is referred to only as ADC). To the negative reference input REF2 of the ADC there is applied the rectified signal U4. Between the reference inputs REF1 and REF2 of the ADC there lies a series of resistances R which form a voltage divider (FIG. 2). To each resistance R there is allocated a comparator K, on one input of which there are applied the partial voltages from U3 and U4, and on the other input of which there is applied the direct-voltage constituent UO as a reference voltage. The reference signal UO is available for this on the input JN.

The ADC is an N-bit converter which generates from the rectified signals U3 and U4 and the reference signal UO an N-bit binary word B1, which relates with the travel angle $\alpha$ over the following function:

$$D = \frac{2^N \times (UO - U4)}{U3 - U4}.$$

For this there is allocated to the outputs of the comparators K a logic circuit L.

Expressed generally, the N-bit binary word B1 generated by the ADC depends on the input signals of the ADC according to the following relation:

$$D = \frac{2^N \times (\text{Signal on } JN - \text{Signal on } REF2)}{\text{Signal on } REF1 - \text{Signal on } REF2}$$

The ADC has the property of issuing the output value rounded off. Accordingly, the ADC generates an N-bit binary word B1 which relates with the travel angle over the following exact function:

$$D = \text{Integer}\left(0.5 + \frac{2^N \times (UO - U4)}{U3 - U4}\right).$$

Since this type of rounding off in ADC's is well-known to workers in the field, it is no longer mentioned in the following discussion.

The reference signal UO can be obtained in a manner known per se by linking the scanning signals U1 and U2, or from a so-called constant-light track of the position measuring apparatus P.

For a better understanding of the following explanation, let it be assumed that the analog scanning signals U1 and U2 are symmetrical to the reference signal UO=0 volts. This can be achieved by means of a linkage known per se of several analog signals phase-shifted against one another in each case by 90°. In the following, there is considered the transfer function D of the ADC for the four quadrants I to IV of the scanning signals U1 and U2 (FIGS. 3a and 3b):

Quadrant I:
$$\left.\begin{array}{l}U3 = A\sin\alpha \\ U4 = -A\cos\alpha\end{array}\right\} D = \frac{2^N}{1 + \tan\alpha}$$

Quadrant II:
$$\left.\begin{array}{l}U3 = A\sin\alpha \\ U4 = A\cos\alpha\end{array}\right\} D = \frac{2^N}{1 + \tan\alpha}$$

Quadrant III:
$$\left.\begin{array}{l}U3 = -A\sin\alpha \\ U4 = A\cos\alpha\end{array}\right\} D = \frac{2^N}{1 + \tan\alpha}$$

Quadrant IV:
$$\left.\begin{array}{l}U3 = -A\sin\alpha \\ U4 = -A\cos\alpha\end{array}\right\} D = \frac{2^N}{1 + \tan\alpha}$$

The travel angle $\alpha$, or, expressed generally, the position value within a signal period, is contained in the transfer function D which gives the starting value of the ADC, as trigonometric function value tangent $\alpha$. In order to establish a linear relation between the output value of the subdivision circuit EXE, which is determined by the N-bit binary word B2, and the travel angle $\alpha$, there is provided at the output of the ADC a correction arrangement KS. This correction arrangement KS is preferably in the form of a table storer which contains in binary form the values 0 to $2^N$. As the correction arrangement KS, there can also be used a computer which linearizes the standing N-bit binary value B1 according to a given correction function. The calculation requires a relatively large amount of time, so that with high relative movement between the measurement member M and the scanning unit A, the table storer is preferably used. The N-bit binary word B1 at the input of the table storer determines which address in the table storer is addressed, so that at the output thereof there is provided a data word B2 which depends directly on the binary word B1 and, in combination with code signals that determine the quadrant of the scanning signal period, represents the subdivision values within a full scanning signal period.

The correction function F according to which the N-bit binary word B1 at the output of the ADC is linearized has the following relation with the transfer function D of the ADC:

$$F = \frac{Q}{360°} \arctan\left(\frac{2^N}{D} - 1\right) \text{ for } 0 \leq \alpha \leq 90°$$

$$\text{and } 180° \leq \alpha \leq 270°$$

$$F = \frac{Q}{360°} \arctan\left(1 - \frac{2^N}{D}\right) \text{ for } 90° < \alpha < 180°$$

$$\text{and } 270° < \alpha < 360°$$

in which $Q = 4 \times 2^N$ and determines the subdivision factor of a scanning signal period.

Figure 3C:
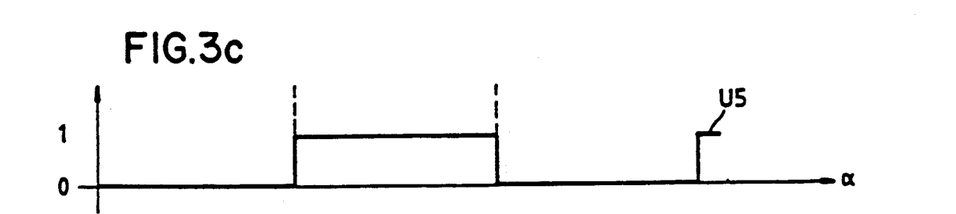
Figure 3D:
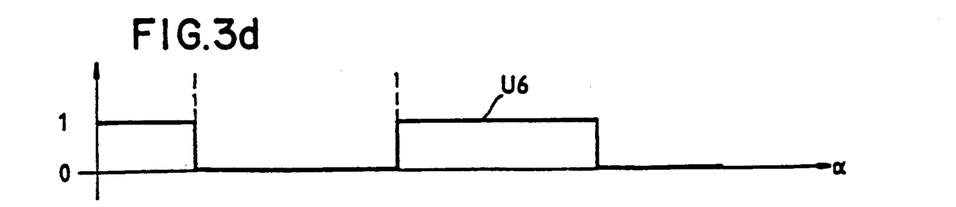

If N is chosen N=8, the ADC generates on its output an 8-bit data word B1, which subdivides ¼ of the scanning signal period into 256 parts. So that the correction function F will be clearly defined over the entire scanning signal period, the correction arrangement KS must obtain the information in which quadrant of the scanning signal period the momentary travel angle $\alpha$ is located. For this, the two analog scanning signals U1 and U2 or the two analog rectified signals U3 and U4 are used. In the example shown in FIG. 1, there is fed to a trigger T1 the one-way rectified signal U3 and to a trigger T2, the one-way rectified signal U4. The rectified signals U3 and U4 are compared with the reference signal UO and the section points detected. At the output of the trigger T1, accordingly, there stands the code signal U5 and at the output of the trigger T2, there is available the code signal U6 for the correction arrangement KS for the quadrant determination (FIGS. 3c and 3d). By the code signals U5 and U6, there are generated in the correction arrangement KS two further bits, so that at the output at N=8, there stands a 10-bit data word B2.

After the linearization in the correction arrangement KS, the value at the output of the correction arrangement KS (subdivision value) stands in a linear relation to the travel angle $\alpha$.

As already mentioned, at the output of the ADC there stands a rounded-off value of the transfer function D as data word B1. In the calculation of the subdivision value with the correction function F, a rounding is likewise required. Through these roundings, errors can arise, which are reduced by the means that in the correction function F, the value Q is chosen smaller than $4 \times 2^N$. The advantage there is the higher accuracy of the linearization. As a disadvantage there is to be considered the reduction of the possible subdivision value within a scanning period. With N=8, the possible subdivision value of a signal period is 1024 for Q=1024, if, however, Q is chosen Q=800, then the subdivision value falls to 800.

As already explained, the N-bit binary word B1 of the ADC depends on the input signals thereto according to the following relation:

$$D = \frac{2^N (\text{Signal on } JN - \text{Signal on } REF2)}{\text{Signal on } REF1 - \text{Signal on } REF2}$$

In the following, there is now examined the case in which the analog scanning signals U1 and U2 lie exchanged on the inputs of the whole-wave rectifiers G1 and G2. At the output of the full-wave rectifier G1 there stands available the following rectified signal:

$U3 = A\cos\alpha + UO$ for $U2 \geq UO$
$U3 = -A\cos\alpha + UO$ for $U1 < UO$ on the output of the full-wave rectifier G2, there stands the signal U4:

$U4 = -A\sin\alpha + UO$ for $U2 \geq UO$
$U4 = A\sin\alpha + UO$ for $U2 < UO$

If these conditions are substituted in the generally valid transfer function D, then there are obtained the following relations:

Quadrants I and III:
$$D = \frac{2^N}{1 + \cot\alpha}$$

Quadrants II and IV:
$$D = \frac{2^N}{1 - \cot\alpha}$$

Correspondingly, the correction function F must also be adapted for the linearization:

$$F = \frac{Q}{360°} \times \text{arc cotan}\left(\frac{2^N}{D} - 1\right) \text{ for } 0 \leq \alpha \leq 90°$$

$$\text{and } 180° \leq \alpha \leq 270°$$

$$F = \frac{Q}{360°} \times \text{arc cotan}\left(1 - \frac{2^N}{D}\right) \text{ for } 90° < \alpha < 180°$$

$$\text{and } 270° < \alpha < 360°$$

The correction arrangement KS here, too, is preferably in the form of a table storer in which for all N-bit binary words B1 of the ADC, corrected data words B2 according to the correction function F are provided.

In FIG. 2, there are shown only the signals for the case in which $U1 = A \sin \alpha + UO$ and $U2 = A \cos \alpha + UO$. For the second case, in which $U1 = A \cos \alpha + UO$ and $U2 = A \sin \alpha + UO$, because of their equivalence, a more detailed discussion of the signals is unnecessary.

Figure 4:
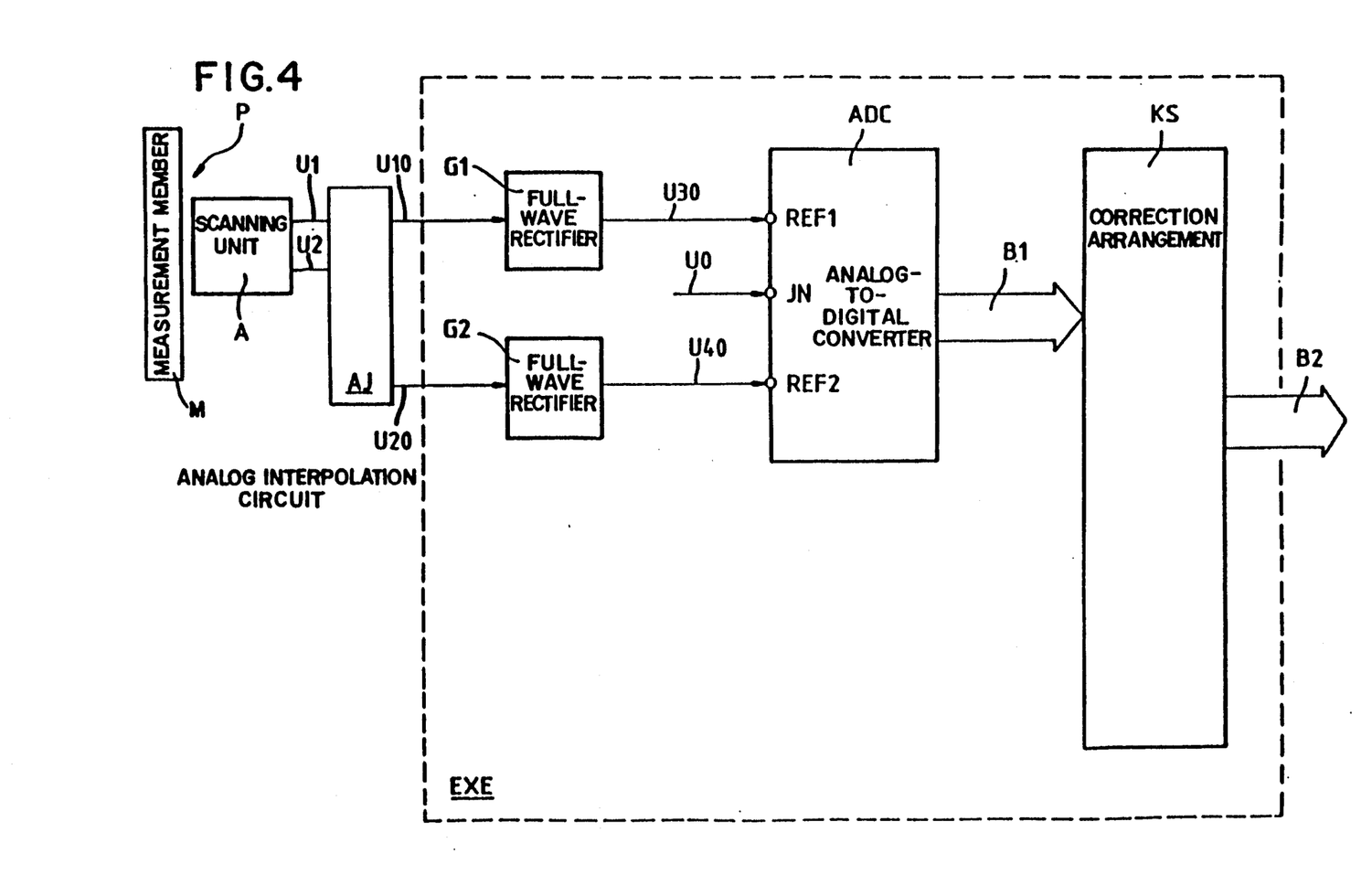
FIG. 4 illustrates a position measuring apparatus with a subdivision circuit according to a second embodiment of the invention.

In an alternative embodiment of the invention as illustrated in FIG. 4, there is allocated to the subdivision circuit EXE an analog interpolation circuit AJ. This analog interpolation circuit AJ has the function of raising the frequency of the scanning signals U1 and U2. At the output of the analog interpolation circuit AJ there are provided the following signals:

$U10 = A\sin(V\alpha) + UO$ for $U1 = A\sin\alpha + UO$
$U20 = A\cos(V\alpha) + UO$ for $U2 = A\cos\alpha + UO$.

wherein V is the factor of the frequency multiplication.

By full-wave rectification of the signals U10 and U20, there are generated the rectified signals U30 and U40, which are applied to the ADC. Into the formula of the transfer function D of the ADC there are to be entered the signals U30 and U40:

$$D = \frac{2^N (UO - U40)}{U30 - U40}$$

The ADC subdivides a full signal period of the scanning signals U1 and U2 into $(4 \times V \times 2^N)$ parts. The binary word B1 on the output of the ADC must, therefore, be linked with code signals which define the $(4 \times V)$th part of a full signal period. For this purpose there can be used the rectified signals U30 and U40 or the scanning signals U1 and U2 or the signals U10 and U20. The generating of code signals was already thoroughly explained in connection with FIG. 1.

As analog interpolation circuit AJ there can be used a known arrangement such as is given in German publication DD-PS 97 336. It is further possible that the two analog signals U10 and U20 be formed from an analog interpolation circuit (not shown), to which are applied the scanning signals of two scanning units. Thus with rotary transmitters it is especially advantageous if two scanning units lying diametrically opposite one another are used, from which there is takable one sine and one cosine signal each. By suitable linking of the four signals a frequency multiplication and simultaneously the elimination of the eccentricity between the angle graduation and the axis of rotation is possible.

Figure 5:
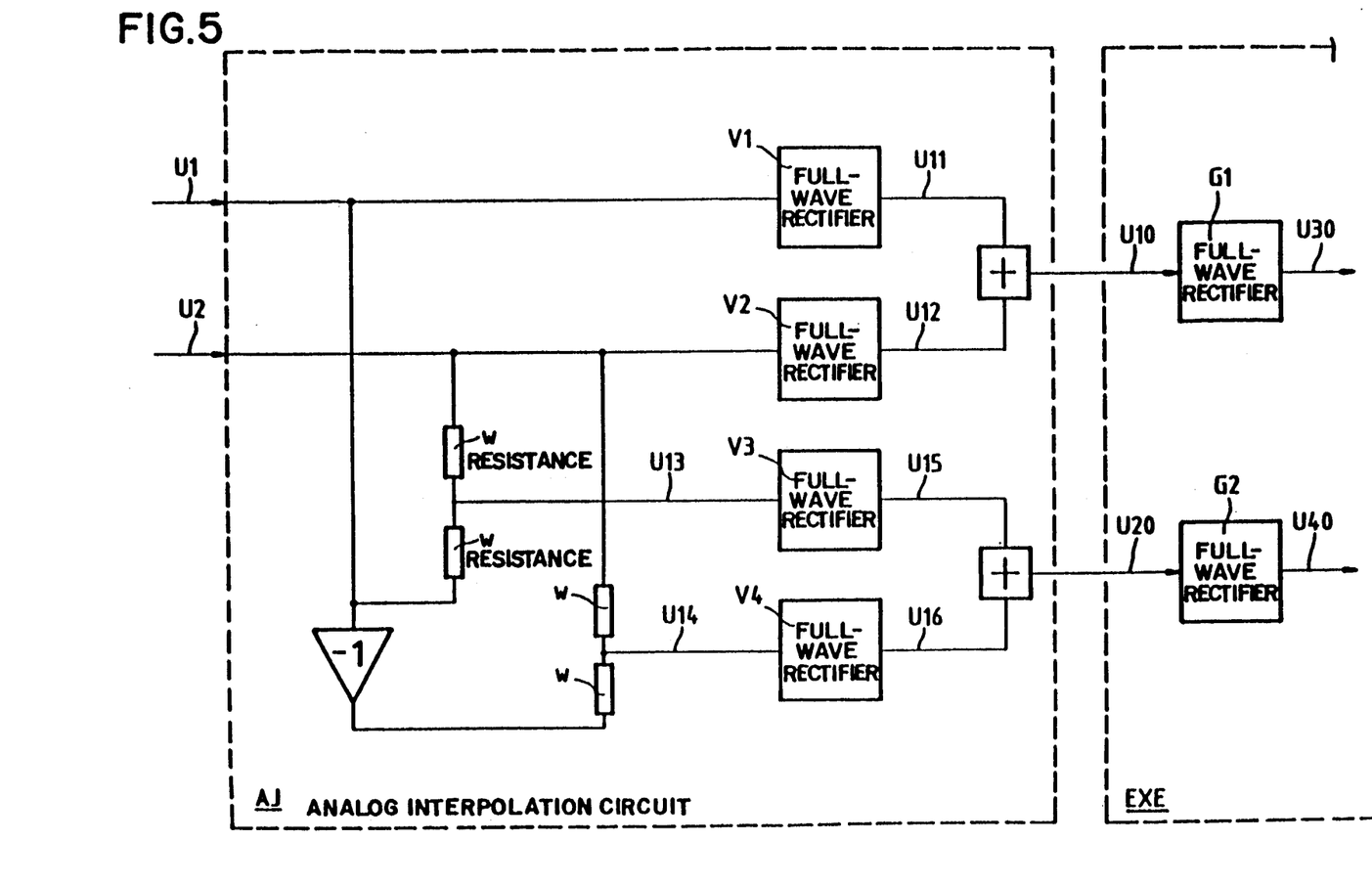
FIG. 5 illustrates the analog interpolation circuit of the position measuring apparatus of FIG. 4.
Figure 6A:
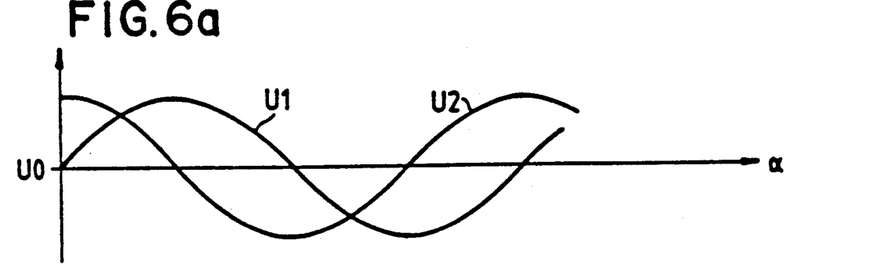
FIGS. 6a, 6b, 6c, 6d and 6e are signal diagrams to assist in explaining the operation of the position measuring apparatus of FIG. 4.
Figure 6B:
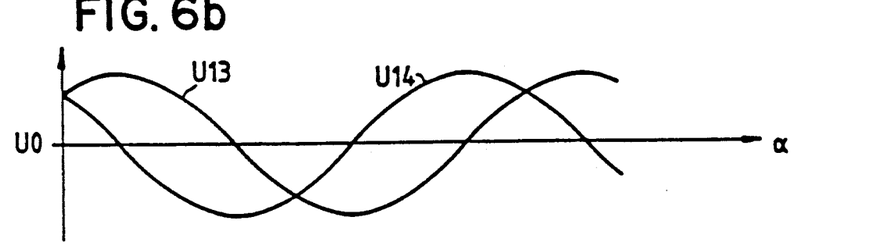
Figure 6C:
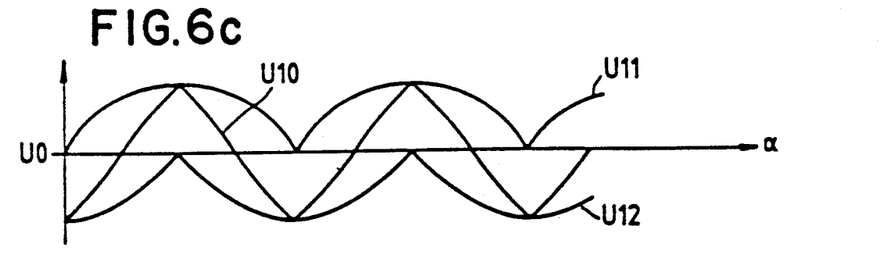
Figure 6D:
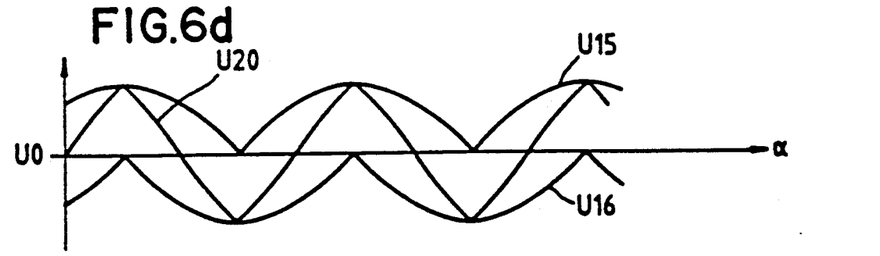
Figure 6E:
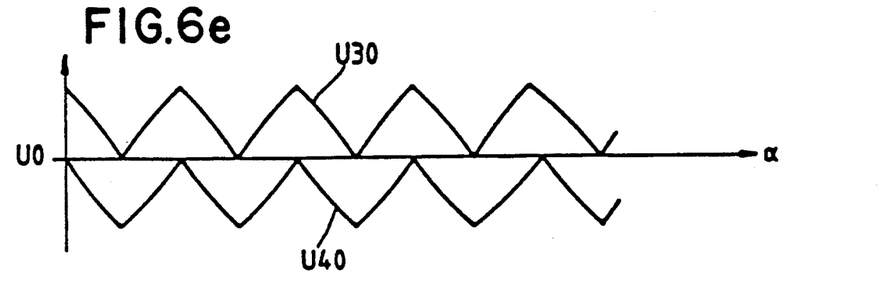

FIG. 5 illustrates the analog interpolation circuit AJ of FIG. 4 in detail. This analog interpolation circuit AJ brings about not only a frequency multiplication, but it simultaneously has the property of establishing a linear relation between the angle $\alpha$ and the voltage of the signals U10 and U20. In the following there is described only the analog interpolation circuit AJ with the factor =2 as frequency multiplication.

Let it be assumed that the scanning signals are $U1=A \sin \alpha + UO$ and $U2=A \cos \alpha + UO$ and $UO=OV$. The scanning signal U1 is fed to a full wave rectifier V1, which forms from it the rectified signal ($U11=|A \sin \alpha|$). The scanning signal U2 is fed to a full-wave rectifier V2, at the output of which there stands the rectified signal ($U12=-|A \cos \alpha|$). The two signals U11 and U12 are added and yield the signal ($U10=|A \sin \alpha|-|A \cos \alpha|$). The signals for the example of FIG. 5 are shown in FIGS. 6a-6e. It is perceived that the signal U10 still has only a sinusoidal course, which comes very close to a triangular course.

For the generation of a second signal U20 phase-shifted by 90° with respect to the signal U10 from the two scanning signals, U1 and U2, there is first formed a signal $U13=A \sin(\alpha+45°)+UO$ and a signal $U14=A \cos(\alpha+45°)+UO$. For this, the scanning signals U1 and U2 are fed to the resistances W of voltage dividers. The signals U13 and U14 can also be written as follows:

$$U13 = \left(\frac{\sqrt{2}}{2} \times A\sin\alpha + UO\right) - \left(\frac{\sqrt{2}}{2} \times A\cos\alpha + UO\right)$$

$$U14 = \left(\frac{\sqrt{2}}{2} \times A\sin\alpha + UO\right) + \left(\frac{\sqrt{2}}{2} \times A\cos\alpha + UO\right)$$

The signal U13 is fed to the full-wave rectifier V3, which forms the rectified signal $$U15=|U13|.$$

The signal U14 is fed to the full-wave rectifier V4, at the output of which there stands the rectified signal $$U16=-|U14|.$$

The two signals U15 and U16 are added and the sum signal U20 stands available to the rectifier circuit G2 of the subdivision circuit EXE for further processing:

$$U20=|U13|-|U14|.$$

From the signal U10 the rectifier circuit G1 of the subdivision circuit EXE forms the rectified signal:

$$U30=||A \sin \alpha|-|A \cos \alpha||$$

The rectifier circuit G2 forms from the signal U20 the rectified signal:

$$U40 = -\left|\left|\frac{\sqrt{2}}{2} \times A\sin\alpha - \frac{\sqrt{2}}{2} \times A\cos\alpha\right| - \left|\frac{\sqrt{2}}{2} \times A\sin\alpha + \frac{\sqrt{2}}{2} \times A\cos\alpha\right|\right|$$

The rectified signal U30 is applied to the positive reference input REF1 of the ADC. At the negative reference input REF2 of the ADC there is applied the rectified signal U40. The transfer function $$D = \frac{2^N \times (U0 - U40)}{U30 - U40}$$

of the ADC is to be considered separately for each octant of a signal period of the scanning signals U1 and U2:

Octant I and V: ($0° < \alpha < 45°$ and $180° \leq \alpha < 225°$)

$$D = \frac{2^N \times \sqrt{2}}{\cot\alpha + (\sqrt{2} - 1)}$$

Octant II and VI: ($45° \leq \alpha < 90°$ and $225° \leq \alpha < 270°$)

$$D = \frac{2^N \times \sqrt{2}}{\tan\alpha + (\sqrt{2} - 1)}$$

Octant III and VII: ($90° \leq \alpha < 135°$ and $270° \leq \alpha < 315°$)

$$D = \frac{2^N \times \sqrt{2}}{-\tan\alpha + (\sqrt{2} - 1)}$$

Octant IV and VIII: ($135° \leq \alpha < 180°$ and $315° \leq \alpha < 360°$)

$$D = \frac{2^N \times \sqrt{2}}{-\cot\alpha + (\sqrt{2} - 1)}$$

In this consideration there were chosen A=1 and UO=0.

The correction function F must likewise be set up in dependence on the octant. This occurs in a manner similar to that which was already described with respect to FIG. 1. So that the entire correction function F is clearly defined over the whole scanning signal period, in this case also the correction arrangement KS must contain the information indicating in which octant of the scanning signal period the momentary scanning value (angle $\alpha$) is present.

In FIG. 5, there is shown only one analog interpolation circuit AJ with the property of frequency doubling. It is also possible to arrange several analog interpolation circuits AJ in succession, the signals U10 and U20 being the input signals of the next interpolation circuit. This successive circuiting has the advantage that the output signals of the last analog interpolation circuit are deformed in such a way that they run approximately linearly, i.e., there exists an approximately linear relation between the signal amplitudes and the travel path (angle $\alpha$).

In the hitherto described executions, there can be used a commercial-grade, relatively economical ADC. In this ADC, all the resistances R of the resistance chain are identical. If these resistances R are made different, i.e., in correspondence to the course of a trigonometric function, then the correction arrangement KS can be dispensed with. On the output of the ADC, there then already stand values which subdivide a fraction of a scanning signal period into equal parts.

In FIG. 1, the scanning signals U1 and U2 are applied directly to the full-wave rectifiers G1 and G2. If the scanning signals U1 and U2 have a small amplitude, it is possible (in a manner not shown) to have amplifiers additionally arranged between the scanning unit A and the full-wave rectifiers G1 and G2 or between the full-wave rectifiers G1 and G2 and the ADC. This holds true also for the embodiment of FIG. 4.

As the ADC there is preferably used a flash converter that assures a rapid analog-to-digital conversion of the analog signals U3 and U4 or U30 and U40 according to the described function.

The subdivision circuit EXE of the invention is usable in various position measuring apparatus P that generate analog location-periodic scanning signals. The measurement member may comprise photoelectric, capacitive, magnetic or inductive measuring apparatus. The measurement member can also, however, be formed by light waves, i.e., the subdivision circuit EXE is also usable for the subdivision of periodic signals in interferometers.

We claim:

1. Position measuring apparatus having a subdivision circuit for subdividing position-dependent analog periodic scanning signals, the subdivision circuit having first and second analog periodic scanning signals phase-displaced with respect to one another as inputs thereto and a digital N-bit data word which represents intermediate values of a signal period of the first and second analog periodic scanning signals as an output therefrom, characterized in that the subdivision circuit includes an analog-to-digital converter and rectifier circuits which derive from the first and second analog periodic scanning signals first and second full-wave rectified signals, so that to a first input of the analog-to-digital converter there is applied the first full-wave rectified signal having signal values only greater than or equal to a direct-voltage constituent of the analog periodic scanning signals, and to a second input of the analog-to-digital converter there is applied the second full-wave rectified signal having signal values only smaller than or equal to the direct-voltage constituent of the analog periodic scanning signals.

2. Position measuring apparatus according to claim 1, further characterized in that the analog-to-digital converter includes a series of resistances and comparators and a logic circuit, and in that the direct-voltage constituent of the analog periodic scanning signals and a partial voltage from the series of resistances are applied to the inputs of each of the comparators and in that the first input of the analog-to-digital converter forms one end of the series of resistances and has applied thereto the first rectified signal having the relation:

$$U3 = U1 \quad \text{for } U1 \geq U0$$
$$U3 = (-U1) + 2U0 \quad \text{for } U1 < U0,$$

and in that the second input of the analog-to-digital converter forms the other end of the series of resistances and has applied thereto the second rectified signal with the relation $$U4 = (-U2) + 2U0 \quad \text{for } U2 \geq U0$$
$$U4 = U2 \quad \text{for } U2 < U0$$

wherein U1 is the first analog periodic scanning signal, U2 is the second analog periodic scanning signal, U3 is the first rectified signal, U4 is the second rectified signal and U0 is the direct-voltage constituent.

3. Position measuring apparatus according to claim 2, further characterized in that the first analog periodic scanning signal $U1 = A \sin \alpha + U0$ and the first rectified signal comprises $$U3 = A\sin\alpha + U0 \quad \text{for } U1 \geq U0$$
$$U3 = -A\sin\alpha + U0 \quad \text{for } U1 < U0$$

and wherein the second analog periodic scanning signal $U2 = A \cos \alpha + U0$ and the second rectified signal comprises $$U4 = -A\cos\alpha + U0 \quad \text{for } U2 \geq U0$$
$$U4 = A\cos\alpha + U0 \quad \text{for } U2 < U0.$$

4. Position measuring apparatus according to claim 3, further characterized in that the analog-to-digital converter contains $2^N - 1$ comparators and $2^N$ resistances for forming a voltage divider, and wherein the analog-to-digital converter generates an N-bit binary word which depends on the input values U0, U3 and U4 according to the transfer function D wherein $$D = \frac{2^N \times (U0 - U4)}{U3 - U4}$$

5. Position measuring apparatus according to claim 4, further characterized in that the output of the analog-to-digital converter is coupled to a correction arrangement which forms a digital data word according to the function:

$$F = \frac{Q}{360°} \times \arctan\left(\frac{2^N}{D} - 1\right) \quad \begin{array}{l} \text{for } 0° \leq \alpha \leq 90° \\ \text{and } 180° \leq \alpha \leq 270° \end{array}$$

$$F = \frac{Q}{360°} \times \arctan\left(1 - \frac{2^N}{D}\right) \quad \begin{array}{l} \text{for } 90° < \alpha < 180° \\ \text{and } 270° < \alpha < 360° \end{array}$$

wherein Q is a value which determines the subdivision factor of a signal period of the analog periodic scanning signals.

6. Position measuring apparatus according to claim 2, characterized in that the first analog periodic scanning signal U1 comprises $A \cos \alpha + UO$ and the first rectified signal comprises $$U3 = A\cos\alpha + UO \quad \text{for } U1 \geq UO$$
$$U3 = -A\cos\alpha + UO \quad \text{for } U1 < UO$$

and the second analog periodic scanning signal U2 comprises $A \sin \alpha + UO$ and the second rectified signal comprises $$U4 = -A\sin\alpha + UO \quad \text{for } U2 \geq UO$$
$$U4 = A\sin\alpha + UO \quad \text{for } U2 < UO.$$

7. Position measuring apparatus according to claim 6, further characterized in that the analog-to-digital converter includes $2^N - 1$ comparators and $2^N$ resistances forming a voltage divider, and that the analog-to-digital converter generates an N-bit binary word which depends on the input values UO, U3 and U4 according to the following transfer function:

$$D = \frac{2^N \times (UO - U4)}{U3 - U4}$$

8. Position measuring apparatus according to claim 7, further characterized in that the output of the analog-to-digital converter is coupled to a correction arrangement which forms a digital data word according to the function:

$$F = \frac{Q}{360°} \times \text{arc cotan}\left(\frac{2^N}{D} - 1\right) \quad \begin{array}{l}\text{for } 0° \leq \alpha \leq 90° \\ \text{and } 180° \leq \alpha \leq 270°\end{array}$$

$$F = \frac{Q}{360°} \times \text{arc cotan}\left(1 - \frac{2^N}{D}\right) \quad \begin{array}{l}\text{for } 90° < \alpha < 180° \\ \text{and } 270° < \alpha < 360°\end{array}$$

wherein Q determines the subdivision factor of a signal period of the analog periodic scanning signals.

9. Position measuring apparatus according to claim 1, further characterized in that the first and second analog periodic scanning signals are applied to an analog interpolation circuit for frequency multiplication, the output of the analog interpolation circuit being fed to the rectifier circuits.

10. Position measuring apparatus according to claim 9, further characterized in that the analog-to-digital converter includes a series of resistances and comparators and a logic circuit, and in that the direct-voltage constituent of the analog periodic scanning signals and a partial voltage from the series of resistances are applied to the inputs of each of the comparators, and that the first input of the analog-to-digital converter forms one end of the series of resistances and has applied thereto the first rectified signal having the relation:

$$U30 = U10 \quad \text{for } U10 \geq UO$$
$$U30 = (-U10) + 2UO \quad \text{for } U10 < UO$$

and in that the second input of the analog-to-digital converter forms the other end of the series of resistances and has applied thereto the second rectified signal having the relation:

$$U40 = (-U20) + 2UO \quad \text{for } U20 \geq UO$$
$$U40 = U20 \quad \text{for } U20 < UO,$$

wherein U10 is a first frequency multiplied analog periodic scanning signal, U20 is a second frequency multiplied analog periodic scanning signal, U30 is the first rectified frequency multiplied signal, U40 is the second rectified frequency multiplied signal and UO is the direct-voltage constituent.

11. Position measuring apparatus according to claim 9 or 10, further characterized in that the first and second analog periodic scanning signals are $$U1 = A\sin\alpha + UO \text{ and}$$
$$U2 = A\cos\alpha + UO$$

and are fed to an interpolation circuit which forms from these scanning signals the first and second frequency multiplied analog periodic scanning signals $$U10 = A\sin(V\alpha) + UO \text{ and}$$
$$U20 = A\cos(V\alpha) + UO$$

in which V is the factor of the frequency multiplication.

12. Position measuring apparatus according to claims 9 or 10, further characterized in that the first and second scanning signals are $$U1 = A\sin\alpha + UO \text{ and}$$
$$U2 = A\cos\alpha + UO$$

and are fed to an interpolation circuit which forms from these scanning signals the signals $$U10 = |A \sin \alpha| - |A \cos \alpha| \text{ and}$$

$$U10 = |A\sin\alpha| - |A\cos\alpha| \text{ and}$$

$$U20 = \left|\frac{\sqrt{2}}{2} \times A\sin\alpha - \frac{\sqrt{2}}{2} \times A\cos\alpha\right| - \left|\frac{\sqrt{2}}{2} \times A\sin\alpha + \frac{\sqrt{2}}{2} \times A\cos\alpha\right|$$

13. Position measuring apparatus according to any of claims 3 to 8, further including means for generating code signals from the first and second analog periodic scanning signals phase-displaced against one another by 90° which subdivide a signal period of the analog periodic scanning signals into four equal sections which are defined in each case by the logical states of the coded signals.

14. Position measuring apparatus according to claim 13, wherein code signals are input to a correction arrangement.

15. Position measuring apparatus according to claim 13, wherein said means for generating code signals comprises triggers to which said first and second rectified signals are applied.

16. Position measuring apparatus to claim 9, further comprising means for raising the frequency of the scanning signals by the factor V, and means for subdividing a Vth part of a full signal period of the scanning signals into the $4 \times 2^N$ parts.

17. Position measuring apparatus to claim 16 wherein said means for raising the frequency is a part of the analog interpretation circuit and said means for subdividing is a part of the analog-to-digital converter.

18. Position measuring apparatus according to claim 16, comprising means for deriving code signals from said scanning signals which determine the $4 \times$ Vth part of a full signal period of the scanning signals.

19. Position measuring apparatus according to claim 18, further characterized in that the output of the analog-to-digital the converter is coupled to a correction arrangement to which there is applied the N-bit data word of the analog-to-digital converter and the code signals, and that the output of the correction arrangement comprises a second digital data word.

20. Position apparatus according to any of claims 5, 8 or 19, further characterized in that the correction arrangement comprises a table storage in which several digital words are deposited and the binary word of the analog-to-digital converter serves as the address for reading-out of the digital word which is provided at the output of the table storage for further processing.

* * * * *